（12） United States Patent
Lance

(10) Patent No.: US 8,405,423 B2
(45) Date of Patent: Mar. 26, 2013

(54) FLEXIBLE BUS DRIVER

(75) Inventor: Philippe Lance, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/119,205

(22) PCT Filed: Sep. 30, 2008

(86) PCT No.: PCT/IB2008/055630
§ 371 (c)(1),
(2), (4) Date: Mar. 16, 2011

(87) PCT Pub. No.: WO2010/038106
PCT Pub. Date: Apr. 8, 2010

(65) Prior Publication Data
US 2011/0163782 A1   Jul. 7, 2011

(51) Int. Cl.
*H03K 19/00* (2006.01)
(52) U.S. Cl. ............................................ 326/82; 326/86
(58) Field of Classification Search .................. None
See application file for complete search history.

(56) References Cited

U.S. PATENT DOCUMENTS

| | | | |
|---|---|---|---|
| 6,243,776 B1 | 6/2001 | Lattimore et al. | |
| 6,703,866 B1 * | 3/2004 | Arimilli et al. | 326/86 |
| 7,400,641 B2 * | 7/2008 | Nitschke et al. | 370/445 |
| 7,411,421 B1 | 8/2008 | Steinke et al. | |

FOREIGN PATENT DOCUMENTS

WO   2008/014370 A   1/2008

OTHER PUBLICATIONS

International Search Report and Written Opinion correlating to PCT/IB2008/055630 dated Jun. 2, 2009.

* cited by examiner

*Primary Examiner* — Crystal L Hammond

(57) ABSTRACT

A bus driver has a ground terminal and a first and a second terminal. In a first operation mode the bus driver provides at the first terminal a first output voltage comprising a first data signal; and at the second terminal the bus driver provides a second output voltage comprising a second data signal. In a second operation mode the bus driver provides at the first terminal a first output voltage comprising a third data signal; and at the second terminal the bus driver provides a second output voltage, wherein a curve of the second output voltage is synchronous however inverted in relation to a curve of the first output voltage. An engine comprises a bus driver as set out above.

20 Claims, 4 Drawing Sheets

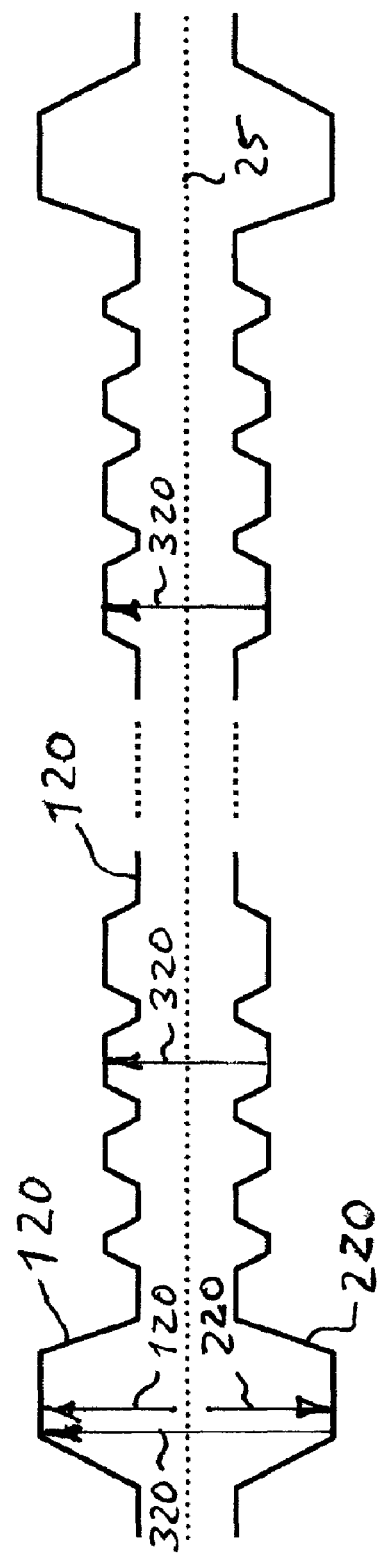

FLEXIBLE BUS DRIVER

FIELD OF THE INVENTION

This invention in general relates to bus drivers and more precisely to a bus driver having a ground terminal. Further, the invention relates to engines.

BACKGROUND OF THE INVENTION

In air bag systems, a bus interface is generally used to connect an accelerometer to a receiver ASIC (application-specific integrated circuit). Different communication bus technologies are employed for signaling and data exchange between at least one remote sensor and a main ECU (electronic control unit). Currently, the two bus protocols DSI (Digital Serial Interface) and PSI (PSI=Peripheral Sensor Interface) share the market. DSI is used on the Japanese market, PSI is employed on the European market, and both protocols are used on the US market. PSI employs a single-ended architecture using only one wire and ground. DSI employs a full differential architecture using an arrangement of two symmetrical wires. Today's air bag bus drivers are customized for each air bag vendor or air bag customer. Many air bag bus drivers are realized as an ASIC.

SUMMARY OF THE INVENTION

The present invention provides a bus driver and an engine as described in the accompanying claims. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawing. Elements in the figures are illustrated for simplicity and clarity and have not necessarily been drawn to scale.

FIG. 4 shows schematically in the upper part of the figure an example of voltage over time on a first of two symmetrical bus wires of the bus of FIG. 3. In the lower part of the figure an example of voltage over time on a second of the two symmetrical bus wires is shown.

DETAILED DESCRIPTION OF THE PREFERRED EMBODIMENTS

Figure 1:
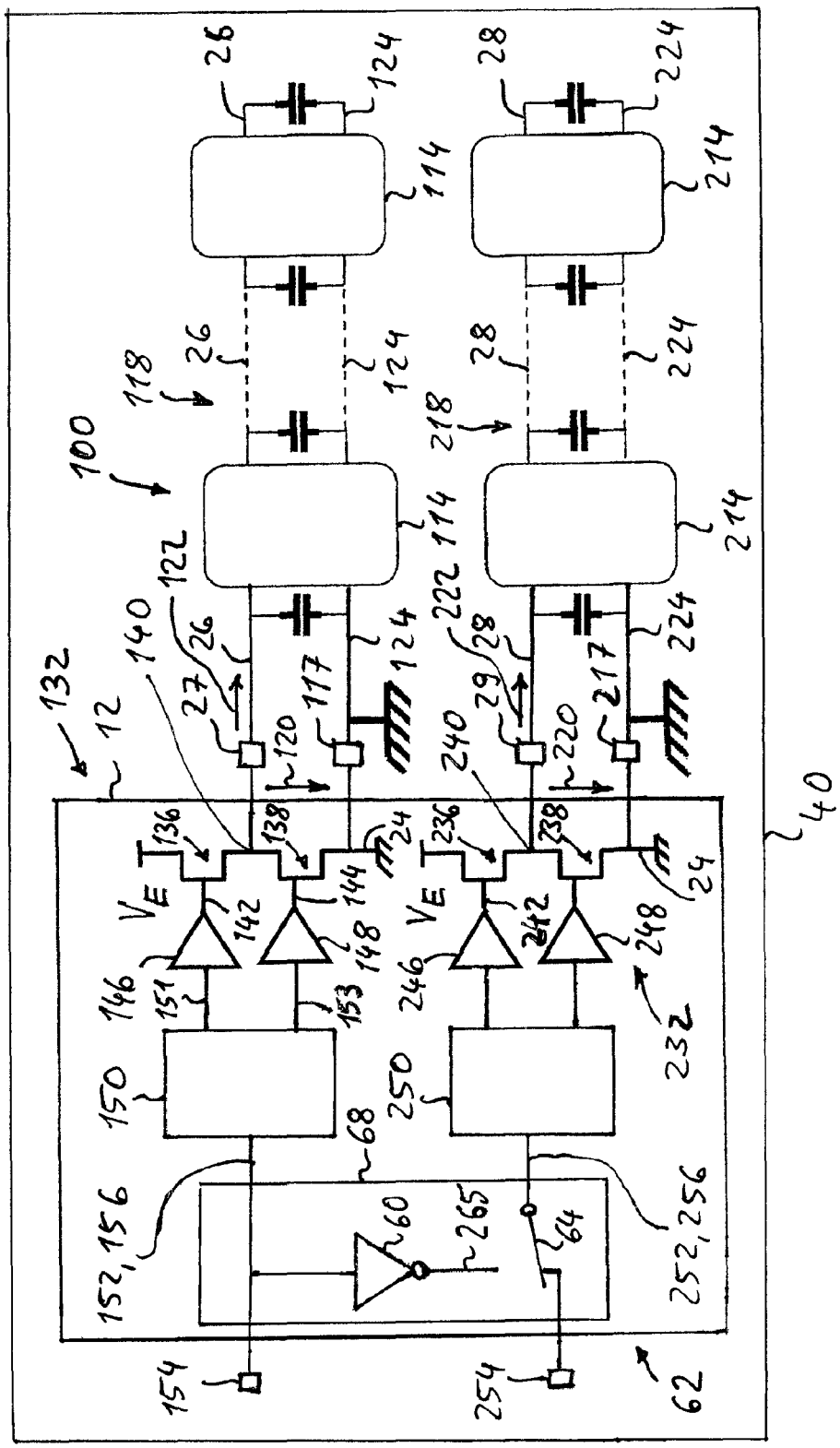
FIG. 1 shows schematically an example of an embodiment of a first bus configuration having a bus driver working in a first operation mode.

FIG. 1 shows schematically a block diagram of an example of an embodiment of the bus driver 12 according to the present invention. In this first bus configuration 100, the bus driver 12 is employed in the first operation mode. A number of slave circuits 114 (i.e. at least one slave circuit 114) are connected to the bus driver 12 via a first bus 118. The bus driver 12 has a first 117 and a second 217 ground terminal and a first terminal 27 for a first bus wire 26 and second terminal 29 for a second bus wire 28. In a first operation mode the bus driver 12 provides at the first terminal 27 a first output voltage 120 comprising a first data signal, wherein the bus driver 12 provides at the second terminal 29 a second output voltage 220 comprising a second data signal. The bus driver 12 comprises a first 132 and a second 232 output stage. The first push-pull output stage 132 has two transistors 136, 138 connected in series. The connection point 140 between both transistors 136, 138 is connected to the first output voltage terminal 27 to be connected with a first 26 of both bus wires 26, 28 of the first bus 118. A drain of a first 136 of both transistors 136, 138 is connected to a power supply VE. A source of the other 138 of both transistors 136, 138 is connected to ground 24. The first transistor 136 is driven via its gate 142 by a first preamplifier 146. The second transistor 138 is driven via its gate 144 by a second preamplifier 148. A first preamplifier driver 150 provides to each of the inputs 151, 153 of both preamplifiers 146, 148 a voltage appropriate to drive the preamplifiers 146, 148 and the transistors 136, 138 assigned thereto such that both transistors 136, 138 work in the well-known push-pull mode as a push-pull output stage 132. A first input 152 of the first preamplifier driver 150 is designed to be fed by signals or information 156 to cause at the output voltage terminal 27 a generation of the first output voltage 120 according to the PSI protocol.

The second push-pull output stage 232 has the same structure as the first push-pull output stage 132. In the first operation mode a bus wire 28 of a second bus 218 is connected to the second output voltage terminal 29. The other bus wire 224 is connected to a ground terminal 217. The connection point 240 between both transistors 236, 238 of the second output stage 232 is connected to the second output voltage terminal 29 to be connected to the second bus wire 28. The gates 242 of the transistors 236 of the second output stage 232 are driven by a third 246 and fourth 248 preamplifier. A second preamplifier driver 250 provides to each of the inputs of both preamplifiers 246, 248 a voltage appropriate to drive the preamplifiers 246, 248 such that both transistors 236, 238 work in the well-known push-pull mode as a push-pull output stage 232 and deliver at the first output voltage terminal 29 a second output voltage 220 complying with the PSI protocol.

In an example of an embodiment the bus driver 12 comprises a first 154 and a second 254 data input terminal, wherein in the first operation mode the bus driver 12 has at least one of the following two features: Firstly, the first output voltage 120 has a curve corresponding to a curve of a voltage 156 at the first data input terminal 154. Secondly, the second output voltage 220 has a curve corresponding to a curve of a voltage 256 at the second data input terminal 254. Therefore, logic 68 having a switching function 62 is provided to connect in a first switch mode 64 the second data input terminal 254 with the data input of the second preamplifier driver 250.

The bus driver 12 functions as a master for the slave circuit 114. For signalling and data communication between the bus driver 12 and the slave circuit 114 a PSI protocol can be employed. The PSI protocol communicates in voltage 120 from the bus driver 12 to the slave 114, and in current 122 from the slave 114 to the bus driver 12. PSI uses a single ended architecture, comprising a ground 124 and only one bus wire 26 for carrying signals and data.

The bus driver 12 functions as a master for the slave circuit 214. For signalling and data communication between the bus driver 12 and the slave circuit 214 a PSI protocol can be employed. The PSI protocol communicates in voltage 220 from the bus driver 12 to the slave 214, and in current 222 from the slave 214 to the bus driver 12. Here also, PSI uses a single ended architecture, comprising a ground 224 and only one bus wire 28 for carrying signals and data.

Figure 2:
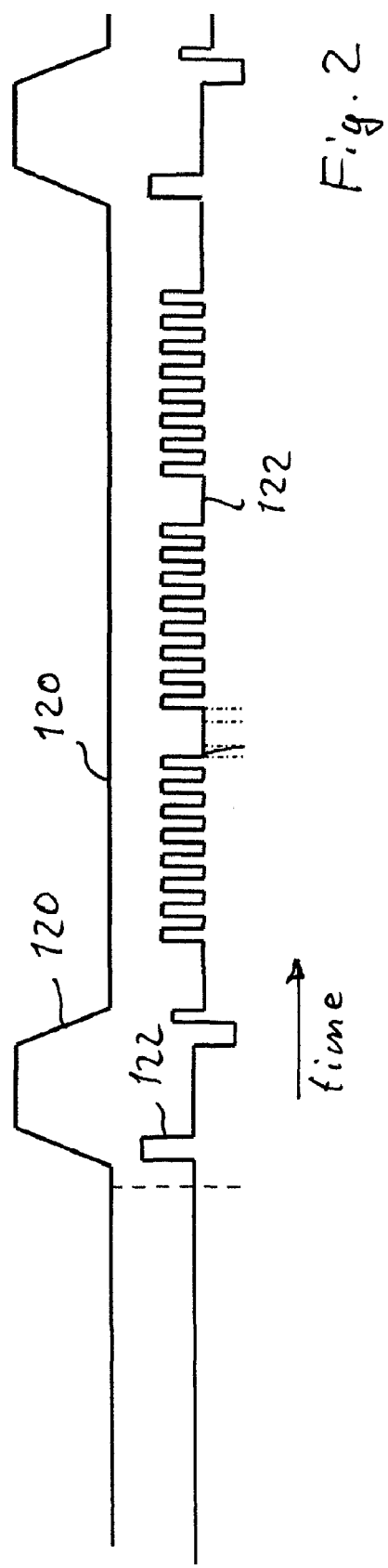
FIG. 2 shows schematically in the upper part of the figure an example of voltage over time on the first bus of FIG. 1. The lower part of the figure shows an example of current over time on the same bus corresponding to the voltage over time.

FIG. 2 shows schematically in the upper part of the figure an example of the voltage 120 over time on the first bus 118 of FIG. 1. The lower part of the figure shows an example of current 122 over time on the first bus 118 of FIG. 1 temporally corresponding to the voltage 120.

Figure 3:
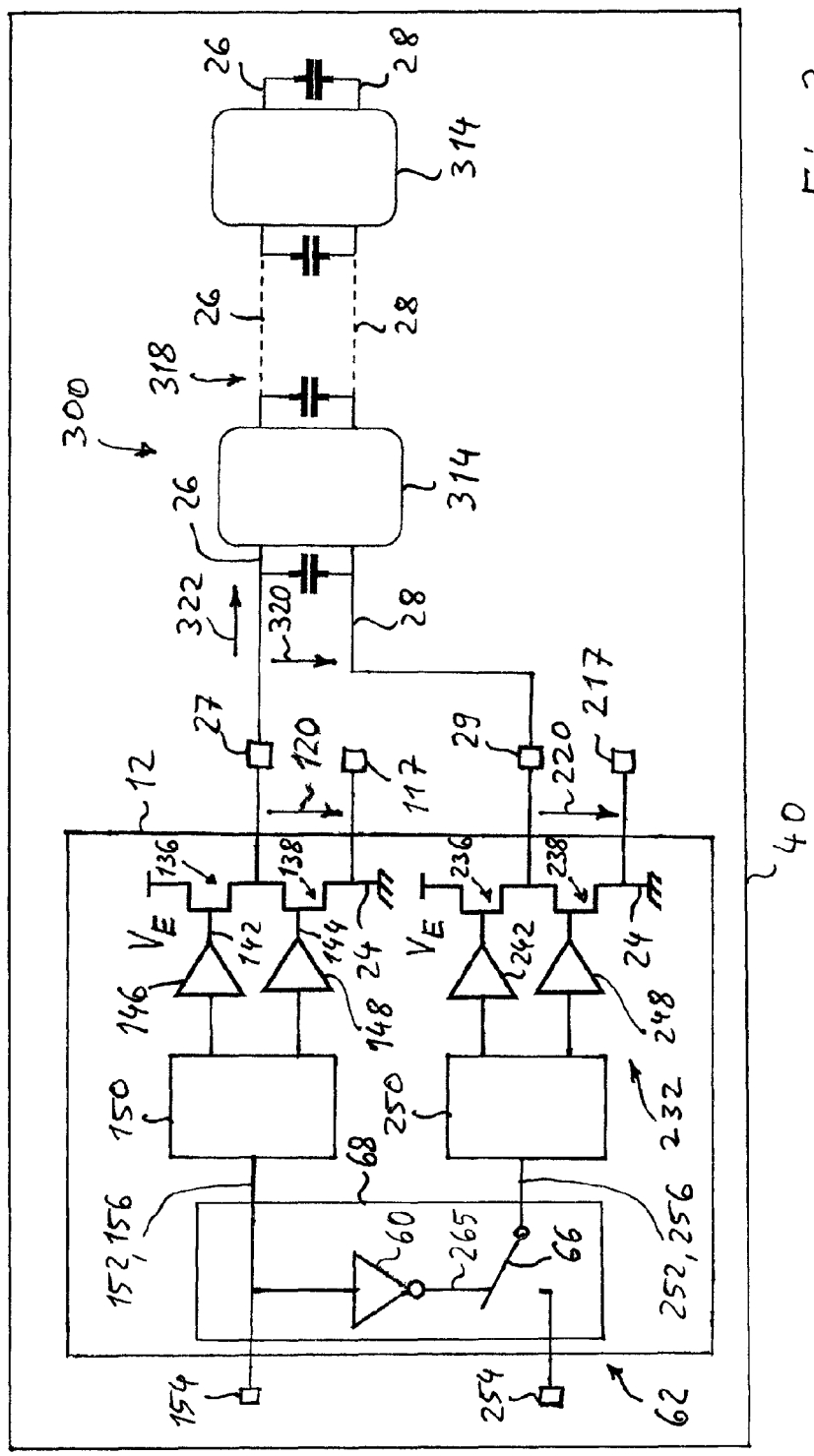
FIG. 3 shows schematically an example of an embodiment of a second bus configuration having a bus driver working in a second operation mode.

FIG. 3 shows schematically a block diagram of an example of an embodiment of the bus driver 12 according to the present invention, wherein the bus driver 12 is employed in the second operation mode. With the second bus configuration 300, a first 26 of two bus wires 26, 28 of a symmetrical third bus 318 is connected to the first output voltage terminal 27. The other bus wire 28 of both symmetrical bus wires 26, 28 of the third bus 318 is connected to the second output voltage terminal 29. A number of slave circuits 314 (i.e. at least one slave circuit 314), are connected to a bus driver 12 via the third bus 318. A first bus wire 26 of the third bus 318 is connected to the first output voltage terminal 27. The other bus wire 28 is connected to the second output voltage terminal 29. Neither of the bus wires 26 and 28 is directly connected to ground 24 or identical with ground 24. The bus driver 12 functions as a master for the slave circuits 314. For signalling and data communication between the bus driver 12 and the slave circuits 314 a DSI protocol can be employed. The DSI protocol communicates in voltage 320 from the bus driver 12 to the slave 314, and in current 322 from the slave 314 to the bus driver 12. DSI uses a full differential output, i.e. two bus wires 26, 28 for carrying signalling and data. The bus driver 12 drives the voltage 320 between both bus wires 26, 28. The voltage 320 is symmetrically in relation to an electrical potential 25 (see FIG. 4) of the electrical ground 24.

FIG. 4 shows schematically in the upper part of the figure an example of voltage 120 over time on a first 26 of the two symmetrical bus wires 26, 28 of the third bus 318. In the lower part of the figure an example of voltage 220 over time on a second 28 of the two symmetrical bus wires 26, 28 is shown. In the second operation mode the bus driver 12 supplies both bus wires 26, 28 with partial voltages 120, 220 in relation to the electrical potential 25 of ground 24, wherein both partial voltages 120, 220 have a same absolute value. However, the polarity of the voltage 120 on bus wire 28 is different to the polarity of the voltage 220 on bus wire 26. The first bus wire 26 receives a positive voltage 120 in relation to ground 24. The second bus wire 28 receives a negative voltage 220 in relation to ground 24. In the second operation mode the bus driver 12 provides at the first terminal 27 a third output voltage 320 in relation to the second terminal 29, wherein the third output voltage 320, as the first partial output voltage 120, comprises a third data signal. A curve of a second output voltage 220 is synchronous however has an inverted curve in relation to the first partial output voltage 120. Therefore, the logic 68 has an inverter 60, wherein the switching function 62 is designed to connect in a second switch mode 66 the data input 252 of the second preamplifier driver 250 with an output of the inverter 60. Then, an input of the inverter 60 is connected to the first data input terminal 254. Each of the first 120 and second 220 output voltages and first 120 and second 220 partial output voltages is an electric potential difference in relation to the potential 25 of ground terminals 117, 217. In a further embodiment the bus driver 12 is an air bag bus driver.

Moreover, each of FIGS. 1 and 3 shows schematically also a block diagram of an example of an embodiment of an engine 40, wherein the engine 40 comprises the bus driver 12. In one embodiment thereof the engine 40 is a vehicle. In another embodiment thereof the engine 40 is a manufacturing machine or a manufacturing plant.

In an example of an embodiment a peak-to-peak value of the first output voltage 120 has the same value as a peak-to-peak value of the second output voltage 220. In a further example of an embodiment the bus driver 12 comprises a first 154 and a second 254 data input terminal, wherein in the second operation mode the third output voltage 320 has a curve corresponding to a curve of a voltage 156 at the first data input terminal 154. In an even further example of an embodiment the bus driver 12 has a first 154 and a second 254 data input terminal and wherein the bus driver 12 has at least one of following three features: Firstly, in the first operation mode the first output voltage 120 has an inverted curve in relation to a curve of the voltage 156 at the first data input terminal 154. Secondly, in the first operation mode the second output voltage 220 has an inverted curve in relation to a curve of the voltage 256 at the second data input terminal 254. Thirdly, in the second operation mode the second output voltage 220 has an inverted curve in relation to a curve of the voltage 156 at the first data input terminal 154.

In a further example of an embodiment the bus driver 12 is designed to be employed in the first operating mode for a PSI bus protocol. In an even further example of an embodiment the bus driver 12 is designed to be employed in the second operating mode for a DSI bus protocol.

The flexible bus driver 12 has at least two outputs 27, 29 which are used in the first operation mode as two independent outputs 27, 29 and in the second operation mode as one differential output 27, 29. The flexible bus driver 12 has, in total, at least three output pins 27, 29, 117, 217 for bus connection. At least one pin 117, 217 thereof is designed to provide a ground potential 25. In an example of an embodiment thereof the two independent outputs 27, 29 of the first operation mode are designed for use with the PSI bus protocol, wherein the single differential output 27, 29 is designed for use with the DSI protocol.

Among the benefits of the flexible bus driver 12 are reduction of cost-overhead, improved economies of scale, increased—but still cost-efficient—flexibility, and reduction of necessary development, validation, qualification, and stockholding resources.

While the principles of the invention have been described above in connection with specific apparatus, it is to be clearly understood that this description is made only by way of example and not as a limitation on the scope of the invention. In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

As used herein, the term "bus" is used to refer to a plurality of signals or conductors which may be used to transfer one piece of data or signalling. The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIGS. 1 and 3, and the discussion thereof, describe an example of an information processing architecture, this example of an architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely examples, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of bus driver 12 are circuitry located on a single integrated circuit or within a same device. Alternatively, bus driver 12 may include any number of separate integrated circuits or separate devices interconnected with each other. Also for example, bus driver 12 or portions thereof may be soft or code representations of physical circuitry or of logical representations convertible into physical circuitry. As such, bus driver 12 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device. For example, a subset or all of the slave circuits 114, 214, 314 may be arranged in one single device or in one integrated circuit. Optionally, even the bus driver 12 may be arranged in one single device together with one or more of the slave circuits 114, 214, 314.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A bus driver comprising:
a ground terminal and a first and a second terminal for a first and a second bus wire, wherein in a first operation mode the bus driver provides at the first terminal a first output voltage comprising a first data signal according to a peripheral sensor interface (PSI) bus protocol and provides at the second terminal a second output voltage comprising a second data signal according to the PSI bus protocol, wherein the ground terminal is connected to a third bus wire during the first operation mode, wherein in a second operation mode the bus driver provides at the first terminal a third output voltage comprising a third data signal according to a digital serial interface (DSI) bus protocol and provides at the second terminal an inverted third output voltage to provide a differential transmission of the third data signal according to the DSI bus protocol, wherein each of the third output voltage and the inverted third output voltage is an electric potential difference in relation to a potential of the ground terminal, wherein the ground terminal is not connected to the third bus wire during the second operation mode.

2. The bus driver as claimed in claim 1, wherein a peak-to-peak value of the first output voltage has the same value as a peak-to-peak value of the second output voltage.

3. The bus driver as claimed in claim 2, wherein the bus driver comprises a first and a second data input terminal, wherein in the first operation mode the bus driver has at least one of:
the first output voltage has a curve corresponding to a curve of a voltage at the first data input terminal; and
the second output voltage has a curve corresponding to a curve of a voltage at the second data input terminal.

4. The bus driver as claimed in claim 2, wherein the bus driver comprises a first and a second data input terminal, wherein in the second operation mode the first output voltage comprising the third data signal has a curve corresponding to a curve of a voltage at the first data input terminal.

5. The bus driver as claimed in claim 2, wherein the bus driver has a first and a second data input terminal and wherein the bus driver has at least one:
in the first operation mode the first output voltage has an inverted curve in relation to a curve of the voltage at the first data input terminal;
in the first operation mode the second output voltage has an inverted curve in relation to a curve of the voltage at the second data input terminal; and
in the second operation mode the first output voltage has an inverted curve in relation to a curve of the voltage at the first data input terminal.

6. The bus driver as claimed in claim 2, wherein the bus driver is an air bag bus driver.

7. An engine, comprising a bus driver as claimed in claim 2.

8. The bus driver as claimed in claim 1, wherein the bus driver comprises a first and a second data input terminal, wherein in the first operation mode the bus driver has at least one of the following two features:
the first output voltage has a curve corresponding to a curve of a voltage at the first data input terminal;
the second output voltage has a curve corresponding to a curve of a voltage at the second data input terminal.

9. The bus driver as claimed in claim 8, wherein the bus driver comprises a first and second data input terminal, wherein in the second operation mode the first output voltage comprising the third data signal has a curve corresponding to a curve of a voltage at the first data input terminal.

10. The bus driver as claimed in claim 8, wherein the bus driver has a first and a second data input terminal and wherein the bus driver has at least one of:
in the first operation mode the first output voltage has an inverted curve in relation to a curve of the voltage at the first data input terminal;
in the first operation mode the second output voltage has an inverted curve in relation to a curve of the voltage at the second data input terminal; and
in the second operation mode the first output voltage has an inverted curve in relation to a curve of the voltage at the first data input terminal.

11. The bus driver as claimed in claim 8, wherein the bus driver is an air bag bus driver.

12. The bus driver as claimed in claim 1, wherein the bus driver comprises a first and a second data input terminal, wherein in the second operation mode the first output voltage comprising the third data signal has a curve corresponding to a curve of a voltage at the first data input terminal.

13. The bus driver as claimed in claim 12, wherein the bus driver has a first and a second data input terminal and wherein the bus driver has at least one of:
in the first operation mode the first output voltage has an inverted curve in relation to a curve of the voltage at the first data input terminal;
in the first operation mode the second output voltage has an inverted curve in relation to a curve of the voltage at the second data input terminal; and
in the second operation mode the first output voltage has an inverted curve in relation to a curve of the voltage at the first data input terminal.

14. The bus driver as claimed in claim 12, wherein the bus driver is an air bag bus driver.

15. The bus driver as claimed in claim 1, wherein the bus driver has a first and a second data input terminal and wherein the bus driver has at least one of:
in the first operation mode the first output voltage has an inverted curve in relation to a curve of the voltage at the first data input terminal;
in the first operation mode the second output voltage has an inverted curve in relation to a curve of the voltage at the second data input terminal; and
in the second operation mode the first output voltage has an inverted curve in relation to a curve of the voltage at the first data input terminal.

16. The bus driver as claimed in claim 1, wherein the bus driver is an air bag bus driver.

17. An Engine, comprising a bus driver as claimed in claim 1.

18. The engine as claimed in claim 17, wherein the engine is one of a vehicle, a manufacturing apparatus, or a manufacturing plant.

19. A bus driver comprising:
a first terminal to connect to a first bus wire;
a second terminal to connect to a second bus wire;
a first ground terminal connected to a ground and coupled to the first terminal; and
a second ground terminal connected to the ground and coupled to the second terminal, wherein in a first operation mode the bus driver provides at the first terminal a first output voltage signal including a first data signal and provides at the second terminal a second output voltage signal including a second data signal, wherein the first ground terminal is connected to a third bus wire and the second ground terminal is connected to a fourth bus wire during the first operation mode, wherein in a second operation mode the bus driver provides at the first terminal a third output voltage signal including a third data signal and provides at the second terminal an inverted third output voltage signal to provide a differential transmission of the third data signal, wherein each of the third output voltage signal and the inverted third output voltage is an electric potential difference in relation to a potential of the ground, wherein the first ground terminal is not connected to the third bus wire and the second ground terminal is not connected to the fourth bus wire during the second operation mode.

20. A method for controlling a bus driver, the method comprising:

during a first operation mode:
providing, at a first terminal of the bus driver, a first output voltage signal including a first data signal, wherein the first terminal is to connect to a first bus wire, and wherein the a ground terminal of the bus driver is to connect to a third bus wire during the first operation mode; and providing, at a second terminal of the bus driver, a second output voltage signal including a second data signal, wherein the second terminal is configured to connect to a second bus wire; and during a second operation mode:
providing, at the first terminal, a third output voltage signal including a third data signal, wherein the first terminal is to connect to the first bus wire, wherein the ground terminal is not connected to the third bus wire during the second operation mode; and providing, at the second terminal, an inverted third output voltage signal to the second terminal, to provide a differential transmission of the third data signal in the second operation mode, wherein each of the third output voltage signal and the inverted third output voltage signal is an electric potential difference in relation to a potential of the ground terminal.

* * * * *